(12) United States Patent
Liu et al.

(10) Patent No.: US 8,729,565 B2
(45) Date of Patent: *May 20, 2014

(54) LAYOUT DESIGN FOR A HIGH POWER, GAN-BASED FET HAVING INTERDIGITATED GATE, SOURCE AND DRAIN ELECTRODES

(71) Applicant: Power Integrations, Inc., San Jose, CA (US)

(72) Inventors: LinLin Liu, Hillsborough, NJ (US); Milan Pophristic, Princeton, NJ (US); Boris Peres, Flanders, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/965,871

(22) Filed: Aug. 13, 2013

(65) Prior Publication Data

US 2013/0328060 A1    Dec. 12, 2013

Related U.S. Application Data

(63) Continuation of application No. 13/655,979, filed on Oct. 19, 2012, now Pat. No. 8,530,903, which is a continuation of application No. 12/821,492, filed on Jun. 23, 2010, now Pat. No. 8,319,256.

(51) Int. Cl.
    *H01L 31/0256*   (2006.01)
(52) U.S. Cl.
    USPC ............................ 257/76; 257/192; 257/256
(58) Field of Classification Search
    USPC ............... 257/76, 192, 256, E29.09, E29.312
    See application file for complete search history.

(56) References Cited

U.S. PATENT DOCUMENTS

| 5,168,329 | A  | 12/1992 | Shiga |
| 6,797,553 | B2 | 9/2004  | Adkisson et al. |
| 6,963,140 | B2 | 11/2005 | Sin et al. |

(Continued)

FOREIGN PATENT DOCUMENTS

EP    2 161 754    3/2010

OTHER PUBLICATIONS

Author unknown, "Microwave FET tutorial" downloaded at http://www.microwaves101.com/encyclopedia/FETs.cfm updated Jan. 22, 2006, 14 pages.

(Continued)

*Primary Examiner* — Phuc Dang
(74) *Attorney, Agent, or Firm* — Stuart H. Mayer; Mayer & Williams PC

(57) ABSTRACT

A FET includes a first and second set of finger arrays that each include a source, gate and drain. A first source pad is electrically coupled to source electrodes in the first set of finger arrays. A second source pad is electrically coupled to the source electrodes in the second set of finger arrays. A common drain pad is electrically coupled to drain electrodes in the first and second set of finger arrays. A first gate pad is electrically coupled to gate electrodes in the first set of finger arrays. A second gate pad is electrically coupled to gate electrodes in the second set of finger arrays. A substrate is also provided on which are disposed the first and second set of finger arrays, the first and second source pads, the common drain pad, and the first and second gate pads.

20 Claims, 7 Drawing Sheets

(56) References Cited

U.S. PATENT DOCUMENTS

| | | |
|---|---|---|
| 8,097,906 B2 | 1/2012 | Takagi |
| 8,319,256 B2 * | 11/2012 | Liu et al. .................. 257/192 |
| 8,530,903 B2 * | 9/2013 | Liu et al. .................. 257/76 |
| 2002/0125506 A1 | 9/2002 | Yoshida et al. |
| 2003/0057502 A1 | 3/2003 | Yamamoto |
| 2003/0102494 A1 | 6/2003 | Akamine et al. |
| 2006/0022218 A1 | 2/2006 | Masumoto et al. |
| 2006/0226477 A1 | 10/2006 | Brar et al. |
| 2006/0231861 A1 | 10/2006 | Akamatsu et al. |
| 2006/0284261 A1 | 12/2006 | Sriram |
| 2010/0019314 A1 | 1/2010 | Kachi |
| 2010/0270559 A1 | 10/2010 | Ota |

OTHER PUBLICATIONS

EPO Search Report issued Apr. 10, 2013 in connection with corresponding EP Application No. 11170153.8 (7 pages total).

* cited by examiner

LAYOUT DESIGN FOR A HIGH POWER, GAN-BASED FET HAVING INTERDIGITATED GATE, SOURCE AND DRAIN ELECTRODES

STATEMENT OF RELATED APPLICATION

This application is a continuation of U.S. patent application Ser. No. 13/655,979, filed Oct. 19, 2012, entitled "LAYOUT DESIGN FOR A HIGH POWER, GaN-BASED FET HAVING INTERDIGITATED ELECTRODES", now U.S. Pat. No. 8,530,903, issued Sep. 10, 2013, which is a continuation of U.S. patent application Ser. No. 12/821,492, filed Jun. 23, 2010, entitled "LAYOUT DESIGN FOR A HIGH POWER, GaN-BASED FET", now U.S. Pat. No. 8,319,256, issued Nov. 27, 2012, which are incorporated herein by reference in their entirety.

FIELD OF THE INVENTION

The present invention relates to a high voltage field effect transistor (FET), and more particularly to the layout of a FET which uses a gallium nitride-based compound semiconductor.

BACKGROUND OF THE INVENTION

A field-effect transistor (also referred to as a "FET") is a conventional semiconductor device employable in switch-mode power supplies for use in data processing and telecommunication systems as well as for other applications that use conditioned power for operation of sensitive electronic circuits. The field-effect transistors have almost universally replaced bipolar transistors previously used for inverters (a type or portion of a power supply) as well as the p-n and Schottky diodes used for rectification. The proliferation of the field-effect transistors has, at least in part, been driven by the need to provide highly efficient power supplies with low dc output voltages such as five volts or less at higher current levels. The broad acceptance of the field-effect transistors for the aforementioned applications is a consequence of the low forward voltage drop and fast switching speed as well as the low power consumption employed to enable or disable conduction thereof. As a result, the use of the field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, power supply switching frequencies above one megahertz ("MHz") are desirable to reduce the size of magnetic devices and the capacitive filtering elements of the power supply without compromising the power conversion efficiency. In accordance therewith, field-effect transistors with previously unrealizable characteristics are not only being requested, but are necessary to satisfy the conditions.

To provide increased power handling capabilities, transistors with a larger effective area have been developed. However, as the area of a transistor increases, the transistor may become less suitable for high frequency operations that, typically, require a small source to drain distance so that the carrier transit times are limited. One technique for increasing the area of a transistor while still providing for high frequency operations is to use a plurality of transistor cells that are connected in parallel. Such a configuration includes a plurality of elongated gate "fingers" which control the flow of current through each of the plurality of unit cells. Thus, the source to drain distance of each cell may be kept relatively small while still providing a transistor with increased power handling capability.

A material of choice for high performance field-effect transistors is a semiconductor with high electron mobility, and wide band gap for high breakdown voltage that is capable of being processed with conventional equipment and methods not substantially different from those already developed for silicon and present generations of compound semiconductors. A particularly desirable material is the compound semiconductor known as gallium nitride ("GaN"), which has been used for integrated circuits operable at frequencies well above one gigahertz, and which has been used to produce power field-effect transistors with high performance characteristics. The GaN-based FET device is capable of maximizing electron mobility by forming a quantum well at the heterojunction interface between a AlGaN barrier layer, which has a large band gap, and the GaN layer, which has a narrower band gap. As a result, electrons are trapped in the quantum well. The trapped electrons are represented by a two-dimensional electron gas in the undoped GaN layer. The amount of current is controlled by applying voltage to the gate electrode, which is in Schottky contact with the semiconductors so that electrons flow along the channel between the source electrode and the drain electrode.

As the market for GaN-based FETs continues to grow, many improvements remain desirable to enhance various operating characteristics such as the breakdown voltage $V_{br}$, on-resistance and the cut-off frequency.

SUMMARY

In accordance with the present invention, a FET is provided which includes a substrate, a buffer layer disposed on the substrate, a channel layer disposed over the buffer layer and a barrier layer disposed over the channel layer. Source, gate and drain electrodes are located over the barrier layer and extend in a longitudinal direction thereon. A portion of the channel and barrier layers define a mesa extending in the longitudinal direction and the source and drain electrodes extend beyond an edge of the mesa. The gate electrodes extend along an edge sidewall of the mesa. A conductive source interconnect is disposed over the buffer layer and have a first end electrically connected to the source electrode. A first dielectric layer is disposed over the buffer layer and over the source interconnect. A gate via is formed in the first dielectric layer. A conductive gate node extends along the buffer layer and electrically connects the portion of the gate electrode extending along the sidewall of the mesa. A gate pad is disposed on the first dielectric layer adjacent the mesa. A conductive gate connect strip is located over the gate node and is in contact therewith. The gate strip is in electrical contact with the gate pad. A source via is formed in the first dielectric layer and a source pad is formed in the source via. The conductive source interconnect has a second end in electrical contact with the source pad.

In accordance with another aspect of the invention, a FET is provided which includes a first and second set of finger arrays that each include a source, gate and drain. A first source pad is electrically coupled to source electrodes in the first set of finger arrays. A second source pad is electrically coupled to the source electrodes in the second set of finger arrays. A common drain pad is electrically coupled to drain electrodes in the first and second set of finger arrays. A first gate pad is electrically coupled to gate electrodes in the first set of finger arrays. A second gate pad is electrically coupled to gate electrodes in the second set of finger arrays. A substrate is also provided on which are disposed the first and second set of finger arrays, the first and second source pads, the common drain pad, and the first and second gate pads.

DETAILED DESCRIPTION

Figure 1:
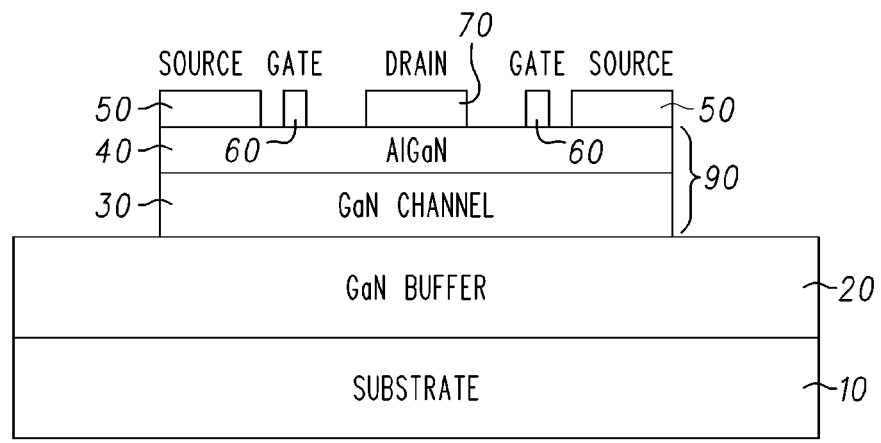
FIG. 1 is a cross-section through two GaN-based FET cells constructed in accordance with the present invention.

FIG. 1 is a cross-section through two GaN-based FET cells constructed in accordance with the present invention. As shown, a heterojunction structure is formed on a semi-insulating substrate 10 such as a sapphire substrate. The heterojunction structure includes a buffer layer 20 of GaN, for example, formed on the substrate 10. A mesa 90 is formed on the buffer layer 20. The mesa 90 includes an undoped GaN layer 30 and an undoped barrier layer 40 (e.g., AlGaN), which is generally much thinner than the undoped GaN layer 30. The undoped GaN layer 30 serves as the channel layer. Source electrodes 50 and drain electrodes 70 are arranged on the undoped barrier layer 40. Gate electrodes 60 are also formed onto the undoped AlGaN layer 40 and are situated between the source electrodes 50 and the drain electrodes 70.

Figure 2:
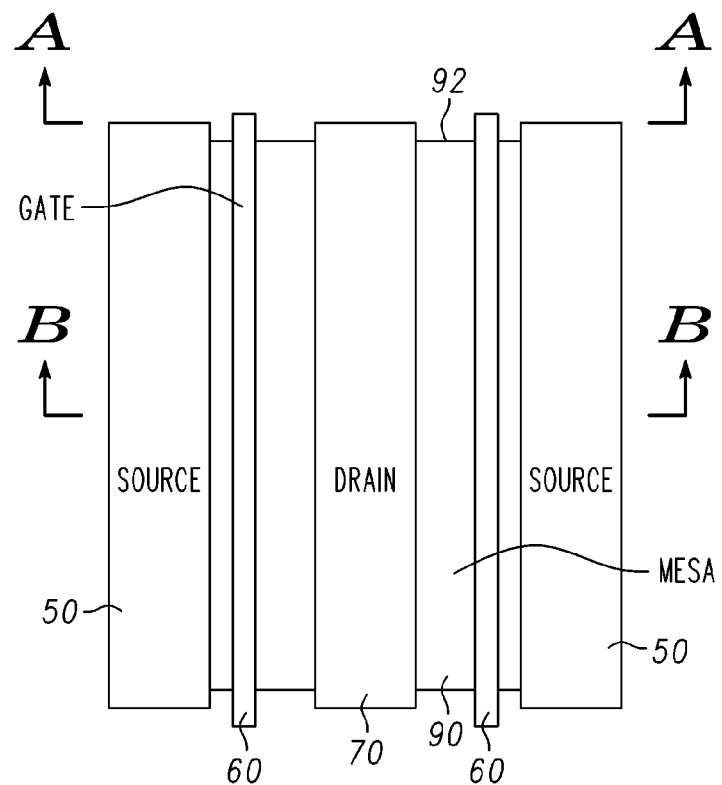
FIG. 2 is plan view of the GaN-based FET shown in FIG. 1.
Figure 3:
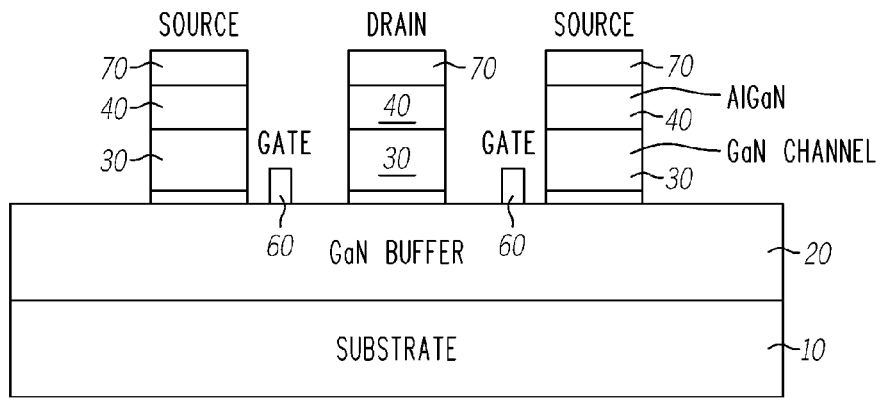
FIG. 3 is a cross-sectional view taken along line A-A in FIG. 2.

FIG. 2 is plan view of the GaN-based FET in which two gate "fingers" are shown. It should be noted that in FIGS. 1 and 2, as well as the figures that follow, like elements are denoted by like reference numerals. The source electrodes 50, gate electrodes 60 and drain electrodes 70 are interdigitated. The electrodes (fingers) extend in the longitudinal direction with a width W and length L. The cross-sectional view of FIG. 1 is taken through the center of the mesa 90 along line B-B in FIG. 2. As FIG. 2 shows, the gate electrodes 60 extend beyond the edge of the mesa 90 in the longitudinal direction. In addition, the channel 30, barrier layer 40 and source and drain electrodes 50 and 70 also extend beyond the edge of the mesa 90 in the longitudinal direction. This is most clearly shown in FIG. 3, which is a cross-sectional view taken along line A-A in FIG. 2. In some embodiments of the invention the source and drain electrodes 50 and 70 extend about 2-3 microns beyond the edge of the mesa. The gate electrodes 60 extend from the upper surface of the mesa 90 and down along the mesa sidewall 92 where they contact the buffer layer 20, as shown in the combination of FIG. 1 and FIG. 4.

Figure 4:
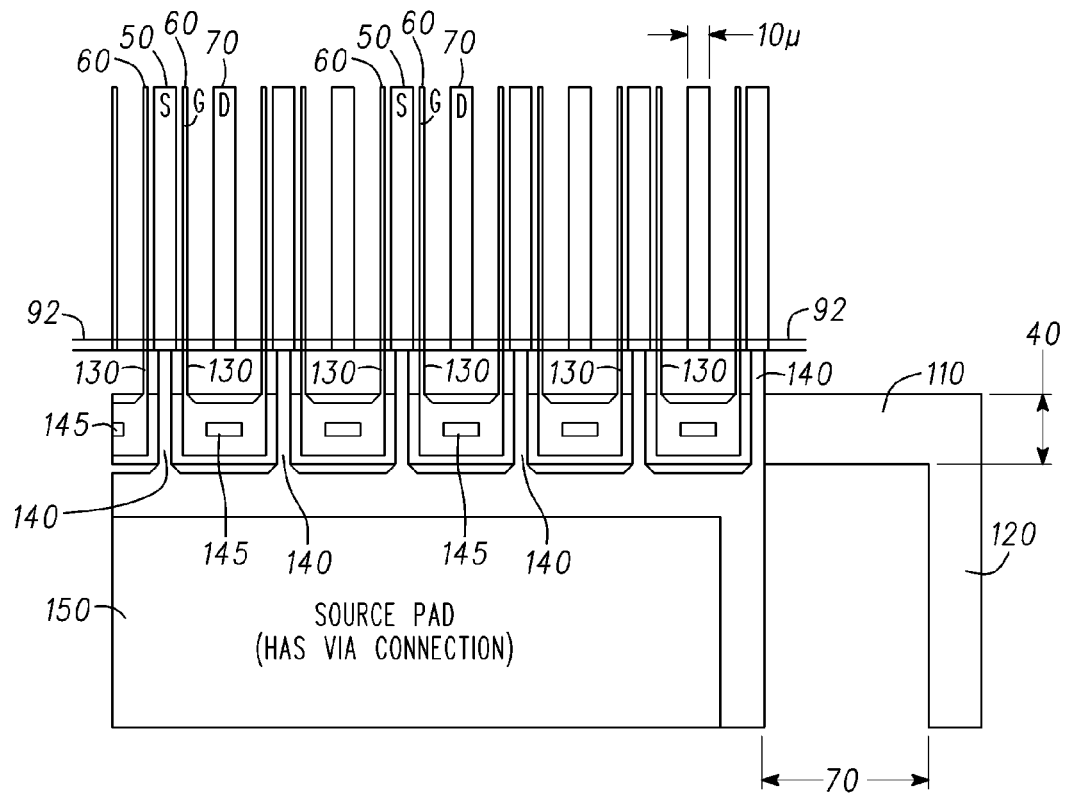
FIG. 4 is an expanded plan view of the GaN-based FET showing multiple fingers.
Figure 5:
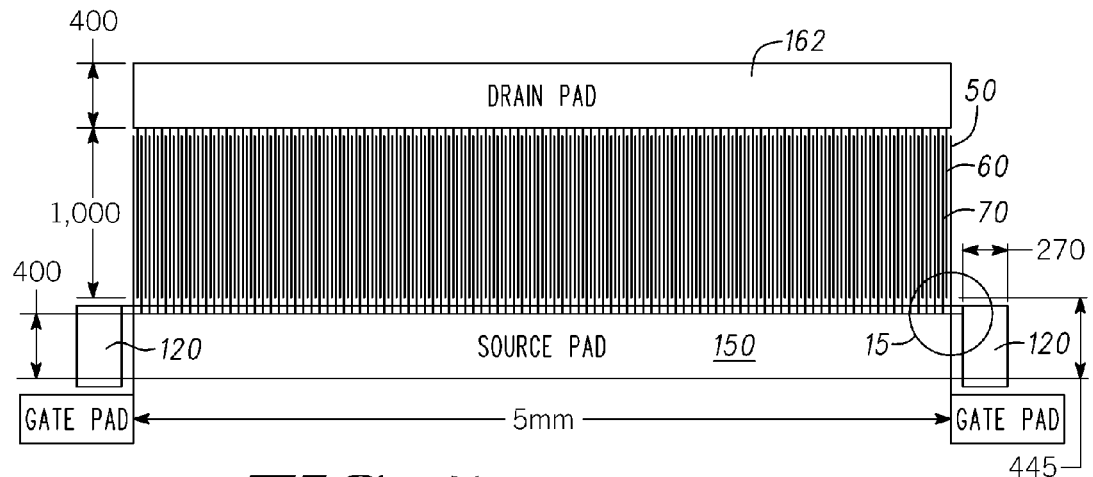
FIG. 5 is an even more greatly expanded plan view of the GaN-based FET shown in FIG. 4.

FIG. 4 is an expanded plan view of the GaN-based FET showing multiple fingers along with the gate pad 120 and source pad 150 located on the buffer layer 20. FIG. 5 is an even more greatly expanded plan view of the GaN-based FET showing two gate pads 120, source pad 150 and drain pad 162. FIG. 4 is a detail from the portion of FIG. 5 represented within circle 15. As best seen in FIG. 4, the gate electrodes 60 along the mesa sidewall 92 are each connected to a conductive gate interconnect 130. As shown, adjacent conductive gate interconnects 130 meet at conductive gate nodes 145. The conductive gate nodes 145 are each connected to a conductive gate connect strip 110, which in turn is connected to the gate pad 120. In this way the gate electrodes 60 are in electrical communication with the gate pad 120. Similarly, the source electrodes 50 are connected to conductive source interconnects 140, which in turn are connected to source pad 150, thereby providing electrical communication between the source electrodes 50 and the source pad 150. As shown in FIG. 5, the drain pad 162 is configured similarly. One advantage of the interconnect layout arrangement shown in FIGS. 4 and 5 is that it avoids the use of an air-bridge, which is often used to connect the source and drain contact while isolating the gate contacts. This is advantageous because air-bridges generally require complex processing steps and can reduce the overall reliability of the device.

Figure 6:
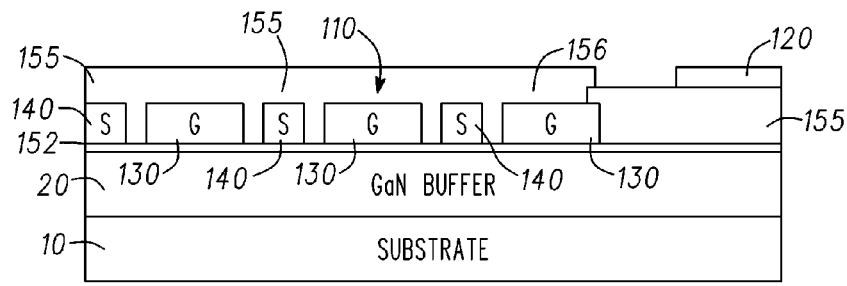
FIG. 6 is cross-sectional view of the FET taken along line C-C in FIG. 4.

FIG. 6 is cross-sectional view taken along line C-C in FIG. 4. Source interconnects 140 are located over the buffer layer 20. Optionally, a dielectric layer 152 (e.g., silicon nitride, silicon dioxide) may be provided on the buffer layer 20. In this case the source interconnects 140 (and source pad 150), as well as the gate interconnects 130 (and gate pad 120), are formed on the dielectric layer 152. The dielectric layer 152 serves to reduce current conduction among the gate source and drain pads, which can be especially problematic when the buffer layer 20 is not highly resistive. A dielectric layer 155 is formed over the source interconnects 140. Gate vias 156 are formed over the gate nodes 145 and filled with conductive materials to form gate interconnects 130. Finally, as further shown in FIG. 6, gate connect strip 110 and gate pad 120 are formed over the gate interconnects 130.

Figure 7:
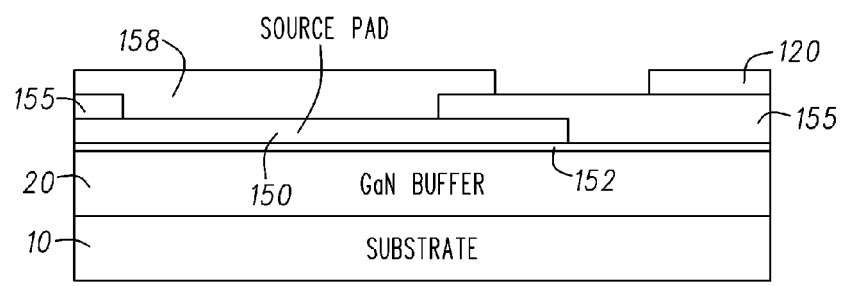
FIG. 7 is cross-sectional view of the FET taken along line D-D in FIG. 4
Figure 8:
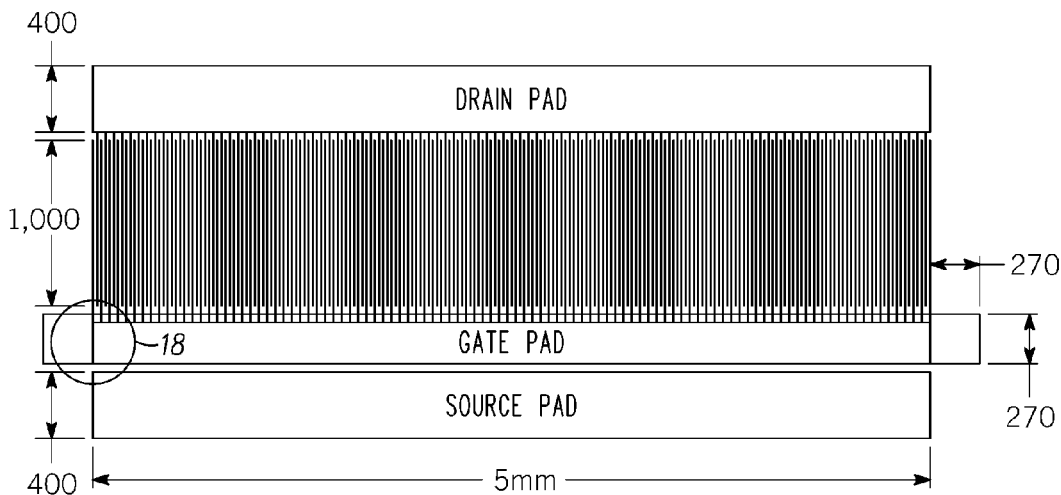
FIG. 8 is expanded plan view of a GaN-based FET in which the gate and source pads overlap.

FIG. 7 is cross-sectional view taken along line D-D in FIG. 4. A source pad via 158 is formed in the dielectric layer 155. The source pad 150 is formed in and above the source pad via 158 and electrically contacts the source interconnects 140 shown in FIG. 4.

In the embodiments of the invention shown in FIGS. 4-7 the gate connect strip 110 that connects all the gate interconnects 130 through the gate vias 156 does not overlap the source pad 150. The gate connect strip 110 does, however, partially overlap the source interconnects 140. One advantage of these embodiments of the invention is that the gate pad 120 and source pad 150 do not overlap, thereby contributing to a reduction in the overall capacitance of the device.

Figure 9:
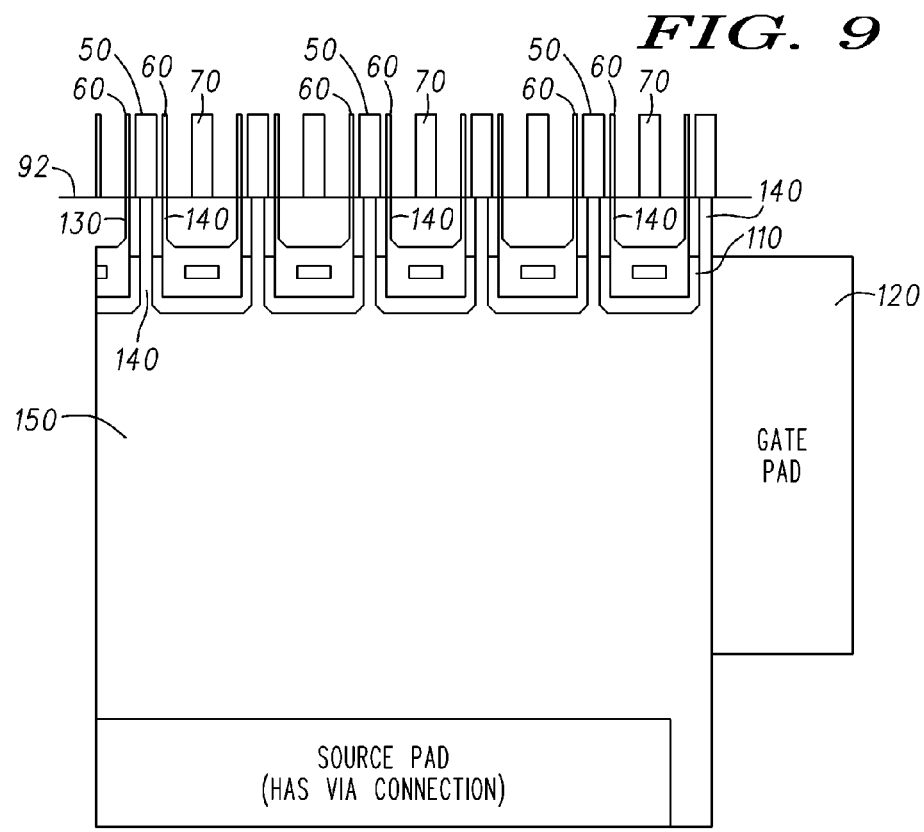
FIG. 9 is detail plan view of the FET shown in FIG. 8.
Figure 10:
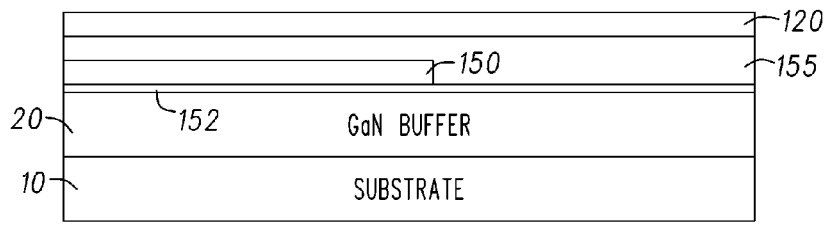
FIG. 10 is cross-section view of a FET through line E-E in FIG. 9.
Figure 11:
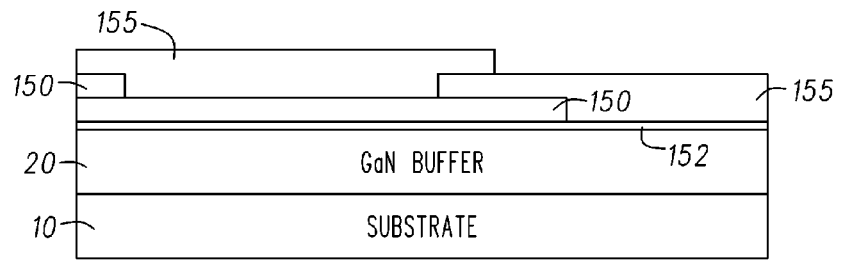
FIG. 11 is cross-sectional view of a FET through line F-F in FIG. 9.

In other embodiments of the invention the gate pad 120 and the source pad 150 overlap. Such an arrangement is shown in the plan view of FIG. 8 (compare to FIG. 5) and in the detail shown in FIG. 9, which depicts the region shown within the circle 18 of FIG. 8. FIG. 10 is cross-section view through line E-E in FIG. 9 and FIG. 11 is cross-sectional view through line F-F in FIG. 9. One advantage of the embodiments of the invention shown in FIGS. 8-11 is that a relatively low spreading resistance can be achieved between the electrodes and the pads. However, the area of overlap between the gate and source pads needs to be carefully arranged so that excessive capacitance can be avoided.

The dimensions of the various features shown in the figures and discussed above may be selected by those of ordinary skill in the art in accordance with well-known principles that involve tradeoffs in various operating parameters. However, for purposes of illustration and not as a limitation on the invention the following dimensions have been found to be suitable for a number of different device applications. For instance, in one embodiment of the invention the gate electrode length is about 3 microns or less, which ensures that the Rds-on is relatively low while still achieving a relatively fast switching speed. If the gate length were much smaller, the gate resistance would increase during switching due to charging and discharging of the gate. In some embodiments of the invention the source and drain electrode lengths are about 10 microns and each finger is about 1000 microns long. In other embodiments each finger is between about 250 microns and 1 mm in length. If the length of the source and gain electrodes were significantly reduced, good current spreading might not be achieved and thus the ohmic contact would be affected. On the other hand, if the electrodes are too big the device will occupy excessive space and manufacturing costs would increase. The length of the gate connect strip 110 may be selected to be about 40 microns to achieve a reasonable gate resistance and to allow for adequate fabrication tolerances. The gate to drain distance is generally about 15 microns or less, with a typical value of about 10 microns. Various other dimensions are denoted on the figures in units of microns. The gate to source spacing will generally be determined by the limitations of the process that is employed, but in some cases will advantageously be submicron.

Figure 12:
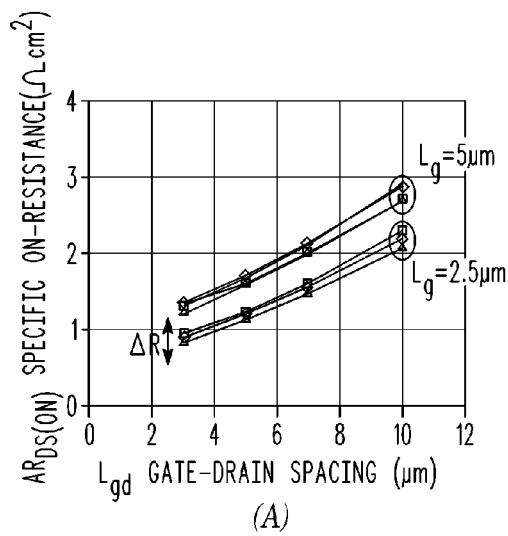
FIG. 12(a) shows the dependence of the specific on-resistance on the gate-to-drain spacing $L_{gd}$ for two different gate lengths $L_g$.
FIG. 12(b) shows the dependence of the breakdown voltage on the gate-to-drain spacing $L_{gd}$.
Figure 12:
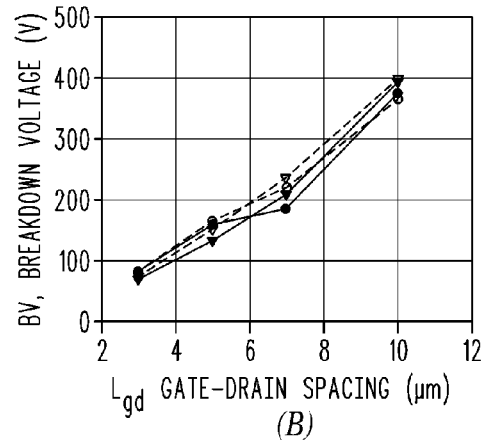

FIG. 12(*a*) shows the dependence of the specific on-resistance on the gate-to-drain spacing $L_{gd}$ for two different gate lengths $L_g$. Likewise, FIG. 12(*b*) shows the dependence of the breakdown voltage on the gate-to-drain spacing $L_{gd}$. These results, based on simulations, show that a low on-resistance and a high breakdown voltage can be achieved by reducing the gate length and increasing the gate-to-drain spacing $L_{gd}$.

Figure 13:
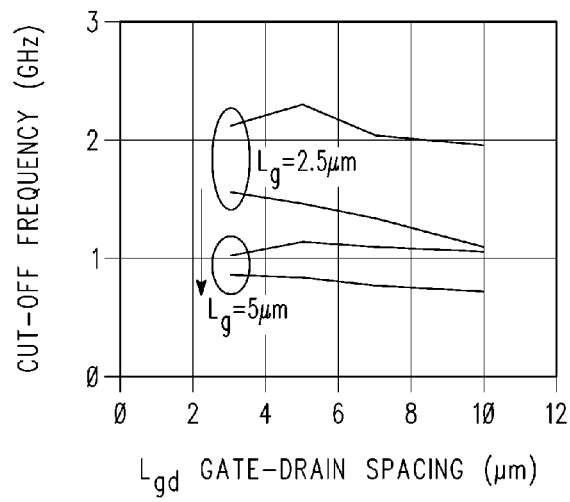
FIG. 13 shows the dependence of the cut-off frequency of the device on the gate-to-drain spacing $L_{gd}$ for two different gate lengths $L_g$.

FIG. 13 shows the dependence of the cut-off frequency of the device on the gate-to-drain spacing $L_{gd}$ for two different gate lengths $L_g$. These simulated results show that the cut-off frequency is degraded as the gate-to-drain spacing $L_{gd}$ increases. Consistent with FIGS. 12(*a*) and 12(*b*), they also show that a longer gate length does not enhance device performance.

Figure 14:
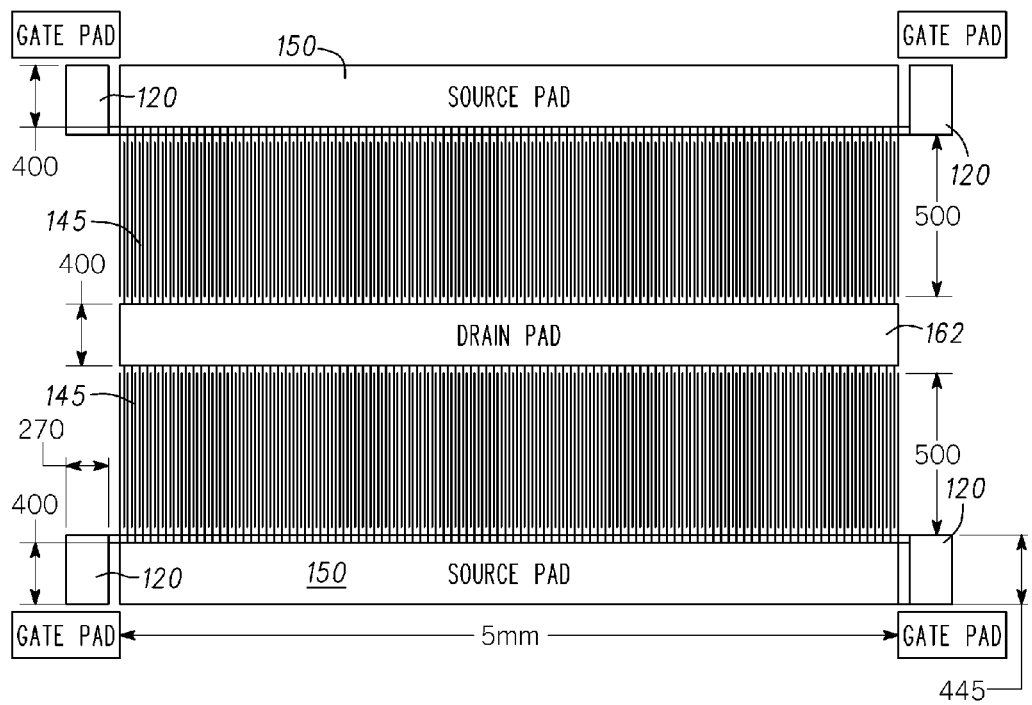
FIG. 14 is a plan view of an alternative embodiment of a FET layout in which there are two sets of finger arrays.
Figure 15:
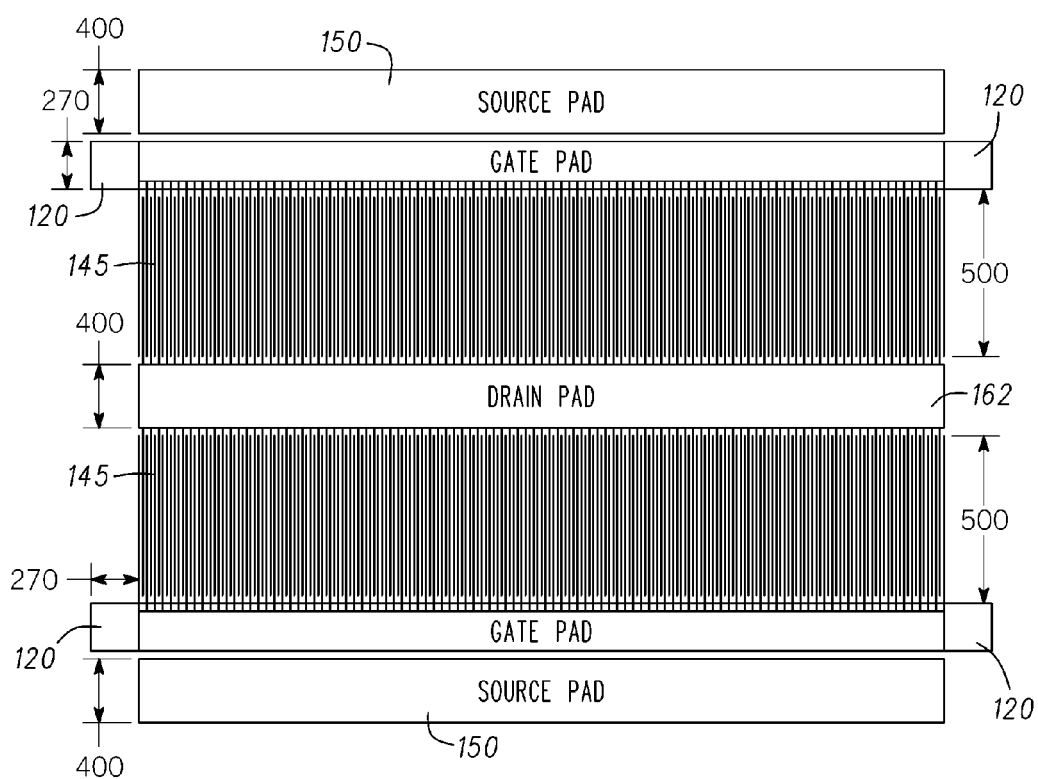
FIG. 15 shows yet another embodiment similar to FIG. 14 but in which the gate pads do overlap with the source pad.

FIG. 14 is a plan view of an alternative embodiment of a FET layout in which there are two sets of fingers 145 instead of the single set of fingers shown in previous embodiments (compare to FIG. 5). That is, in FIG. 14 the total number of fingers of doubled while their widths are halved (e.g., there are 400 fingers, 200 in each set with each finger having a length of 500 microns). The device includes two source pads 150, one drain pad 162 and four gate pad 120s. The drain pad is located between each set of fingers. In FIG. 14 the gate pads 120 do not overlap with the source pad. FIG. 15 shows another embodiment similar to FIG. 14 but in which the gate pads 120 do overlap with the source pad. One advantage of the arrangement shown in FIGS. 14 and 15 is that the source and drain pads are now closer to one another, thus reducing the spreading resistance of the metal interconnects.

Although various embodiments are specifically illustrated and described herein, it will be appreciated that modifications and variations of the present invention are covered by the above teachings and are within the purview of the appended claims without departing from the spirit and intended scope of the invention. For example, while the depletion mode FET has been described as a GaN-based device, the invention more generally encompasses a depletion mode FET that is formed from any Group III nitride compound semiconductor in which the group III element may be gallium (Ga), aluminum (Al), boron (B) or indium (In).

The inventon claimed is:

1. A semiconductor device, comprising:
    a heterostructure that includes a channel layer extending in a longitudinal direction, a first portion of the channel layer being located on a mesa and a second portion of the channel layer being located off the mesa;
    a series of interdigitated gate, source and drain electrodes extending in the longitudinal direction and being disposed over the first portion of the channel layer located on the mesa, the source and drain electrodes extending in the longitudinal direction beyond an edge of the mesa and extending over the second portion of the channel layer, the gate electrodes extending along a sidewall of the mesa;
    a source pad located off the mesa;
    a conductive source interconnect having a first portion electrically connected to one of the source electrodes and a second portion electrically connected to the source pad;
    a gate pad located off the mesa and overlapping the source pad at least in part; and
    a conductive gate interconnect having a first portion electrically connected to a portion of the gate electrode extending along the mesa sidewall, the conductive gate interconnect having a second portion electrically communicating with the gate pad.

2. The semiconductor device of claim 1 further comprising:
    a first dielectric layer disposed under the conductive source interconnect; and
    a source pad via formed in the first dielectric layer, the source pad being located formed in the source pad via.

3. The semiconductor device of claim 2 further comprising:
    a series of gate nodes electrically connected to the portion of one of the gate electrodes extending along the mesa sidewall; and
    a conductive gate connect strip electrically coupling one of the gate nodes to the gate pad.

4. The semiconductor device of claim 3 further comprising a gate via formed in the first dielectric layer, the conductive gate connect strip being connected to the series of gate nodes through the gate via.

5. The semiconductor device of claim 1 wherein the conductive gate connect strip at least partially overlaps the conductive source interconnect.

6. The semiconductor device of claim 4 wherein the conductive gate connect strip has a length of about 40 microns.

7. The semiconductor device of claim 1 wherein the channel layer comprises a group III nitride semiconductor material.

8. The semiconductor device of claim 1 wherein the channel layer comprises GaN.

9. The semiconductor device of claim 1 wherein one of the gate electrodes has a length of about 3 microns.

10. The semiconductor device of claim 1 wherein the source electrodes extend beyond the edge of the mesa by about 2-3 microns.

11. The semiconductor device of claim 1 wherein the source, gate and drain electrodes extend in the longitudinal direction between about 250 microns and 1 mm.

12. The semiconductor device of claim 1 wherein a distance between one of the gate electrodes and one of the drain electrodes is less than about 15 microns.

13. A FET, comprising:
a substrate, a channel layer disposed on the substrate and a barrier layer disposed over the channel layer;
a plurality of source, gate and drain electrodes located over the barrier layer and extending in a longitudinal direction thereon, wherein a portion of the channel and barrier layers define a mesa extending in the longitudinal direction and the source and drain electrodes extend beyond an edge of the mesa and wherein the gate electrodes extends along an edge sidewall of the mesa;
a plurality of conductive source interconnects each having a first end electrically connected to one of the source electrodes;
a first dielectric layer disposed over the conductive source interconnect;
a plurality of conductive gate nodes, each of the conductive gate nodes electrically connecting the portions of a pair of adjacent gate electrodes extending along the sidewall of the mesa;
a plurality of gate pads disposed on the first dielectric layer adjacent the mesa;
a plurality of conductive gate connect strips in contact with the conductive gate nodes, said conductive gate connect strips each being in electrical contact with one of the gate pads;
a source via formed in the first dielectric layer; and
a source pad formed in the source via, the conductive source interconnects each having a second end in electrical contact with the source pad.

14. The FET of claim 13 further comprising at least one set of finger arrays which includes one of the source, gate and drain electrodes.

15. The FET of claim 14 further comprising two finger arrays each of which includes one of the source, gate and drain electrodes.

16. The FET of claim 15 wherein the finger arrays are parallel to one another.

17. The FET of claim 13 further comprising a gate via formed in the first dielectric layer, one of the conductive gate connect strips being connected to one of the gate nodes through the gate via.

18. The FET of claim 13 wherein the gate pads and the source pad do not overlap one another.

19. The FET of claim 13 wherein one of the gate pads and the source pad overlap at least in part.

20. The FET of claim 1 wherein at least one of the conductive gate connect strip at least partially overlaps at least one of the conductive source interconnects.

* * * * *